(12) United States Patent
Liang et al.

(10) Patent No.: US 9,637,375 B2
(45) Date of Patent: May 2, 2017

(54) MEMS DEVICE HAVING A GETTER STRUCTURE AND METHOD OF FORMING THE SAME

(71) Applicant: Taiwan Semiconductor Manufacturing Company Limited, Hsinchu (TW)

(72) Inventors: Chin-Wei Liang, Hsinchu County (TW); Cheng-Yuan Tsai, Hsin-Chu County (TW); Chia-Shiung Tsai, Hsin-Chu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 52 days.

(21) Appl. No.: 14/252,831

(22) Filed: Apr. 15, 2014

(65) Prior Publication Data
US 2015/0291416 A1    Oct. 15, 2015

(51) Int. Cl.
*B81B 7/00* (2006.01)

(52) U.S. Cl.
CPC .................. *B81B 7/0038* (2013.01)

(58) Field of Classification Search
CPC .............................................. H01L 2924/1461
See application file for complete search history.

(56) References Cited

U.S. PATENT DOCUMENTS

| | | | | |
|---|---|---|---|---|
| 5,701,008 A * | 12/1997 | Ray | .................. | G01J 5/045 |
| | | | | 250/349 |
| 6,218,255 B1 * | 4/2001 | Fritzinger et al. | ............ | 438/386 |
| 2003/0141802 A1 * | 7/2003 | Liebeskind et al. | .......... | 313/495 |
| 2004/0248344 A1 * | 12/2004 | Partridge | ............ | B81C 1/00333 |
| | | | | 438/127 |
| 2005/0070090 A1 * | 3/2005 | Lee | ..................... | H01L 21/7684 |
| | | | | 438/629 |
| 2005/0139954 A1 * | 6/2005 | Pyo | ........................ | H01L 23/481 |
| | | | | 257/531 |
| 2009/0035668 A1 * | 2/2009 | Breyta | .................. | B82Y 10/00 |
| | | | | 430/18 |
| 2009/0115047 A1 * | 5/2009 | Haba | ................... | H01L 21/4857 |
| | | | | 257/690 |

(Continued)

OTHER PUBLICATIONS

"Over." Merriam-Webster.com. 2015. http://www.merriam-webster.com (Aug. 2, 2015).*

(Continued)

*Primary Examiner* — Michael Jung
*Assistant Examiner* — Mikka Liu
(74) *Attorney, Agent, or Firm* — Jones Day (57) ABSTRACT

According to an exemplary embodiment, a method of forming a MEMS device is provided. The method includes the following operations: providing a substrate; forming a first layer formed of titanium nitride over the substrate; and forming a second layer formed of titanium over the first layer. According to an exemplary embodiment, a MEMS device is provided. The device includes: a substrate; a first layer formed of titanium nitride over the substrate; and a second layer formed of titanium over the first layer. According to an exemplary embodiment, a getter structure is provided. The structure includes: a first layer formed of titanium nitride over a substrate; and a second layer formed of titanium over the first layer.

17 Claims, 8 Drawing Sheets

(56) References Cited

U.S. PATENT DOCUMENTS

2010/0038730 A1* 2/2010 Sandhu ................ H01H 1/0094
257/415
2011/0115039 A1* 5/2011 Huang ................. B81B 3/0072
257/419

OTHER PUBLICATIONS

Over. (n. d.) Collins English Dictionary—Complete and Unabridged. (1991, 1994, 1998, 2000, 2003). Retrieved Jul. 29, 2015 from http://www.thefreedictionary.com/over.*
Upon. (n. d.) Collins English Dictionary—Complete and Unabridged. (1991, 1994, 1998, 2000, 2003). Retrieved Aug. 2, 2015 from http://www.thefreedictionary.com/upon.*
On. (n. d.) American Heritage® Dictionary of the English Language, Fifth Edition. (2011). Retrieved Aug. 2, 2015 from http://www.thefreedictionary.com/ON.*

* cited by examiner

MEMS DEVICE HAVING A GETTER STRUCTURE AND METHOD OF FORMING THE SAME

BACKGROUND

CMOS-compatible MEMS packaging is widely used nowadays. However, combinations of CMOS technology and MEMS may cause an out-gassing issue. The subsequent pressure level shift within the MEMS device induced by the out-gassing issue may degrade the performance of the devices. Therefore, there is a need to eliminate the issue and enhance the performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure describes a method of forming a MEMS device. This disclosure also provides a MEMS device and a getter structure. The disclosure may include a titanium nitride film deposited between a silicon layer and a titanium layer as a getter so as to increase surface area of the getter. The titanium nitride film may have a thickness of 50 nanometers, and the titanium layer may have a thickness of 300-3000 nanometers. The experimental result shows that surface area of the titanium getter over the titanium nitride film substantially multiplies by about 2.8 times compared to the titanium getter being directed deposited over the silicon layer without the titanium nitride film therebetween.

Figure 1:
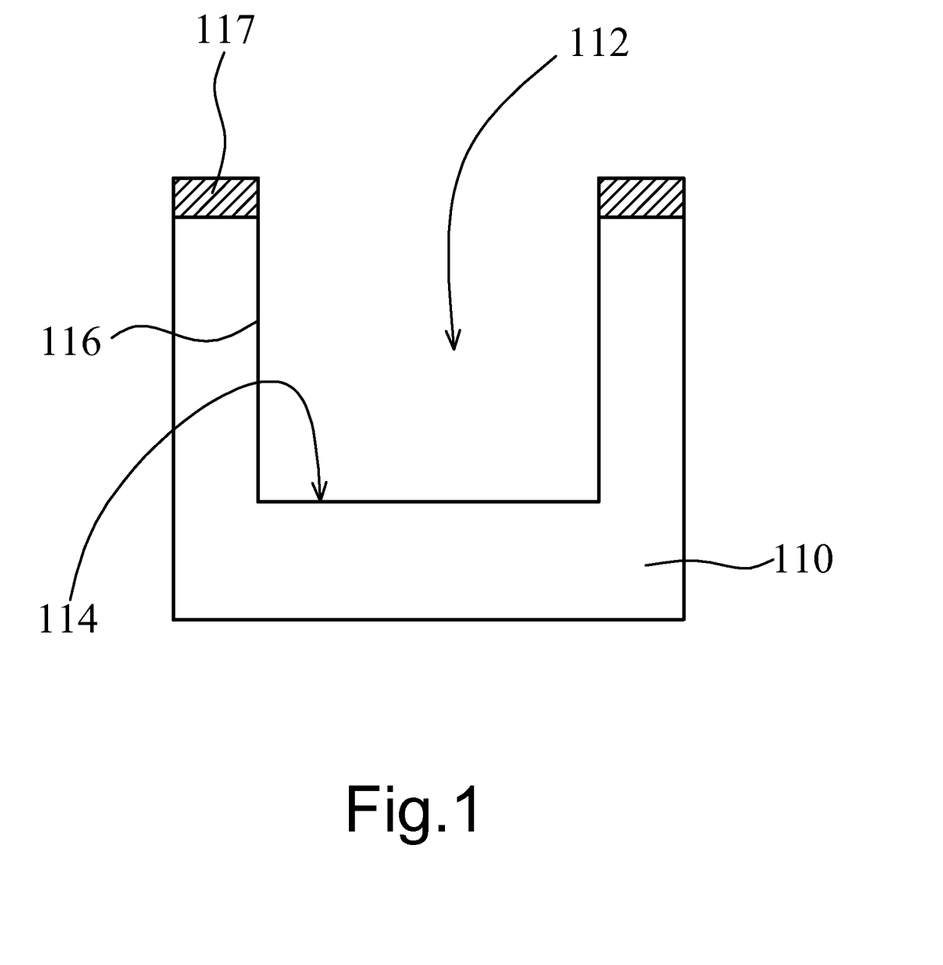
FIG. 1 is a sectional view illustrating an exemplar MEMS device in accordance with some embodiments.

FIG. 1 is a sectional view illustrating an exemplar MEMS device in accordance with some embodiments. As shown in FIG. 1, a substrate 110 is provided. In the substrate 110, a cavity 112 having a bottom surface 114 and a sidewall 116 is formed. Eutectic material 117 is formed over the substrate 110 for further wafer bonding.

Figure 2:
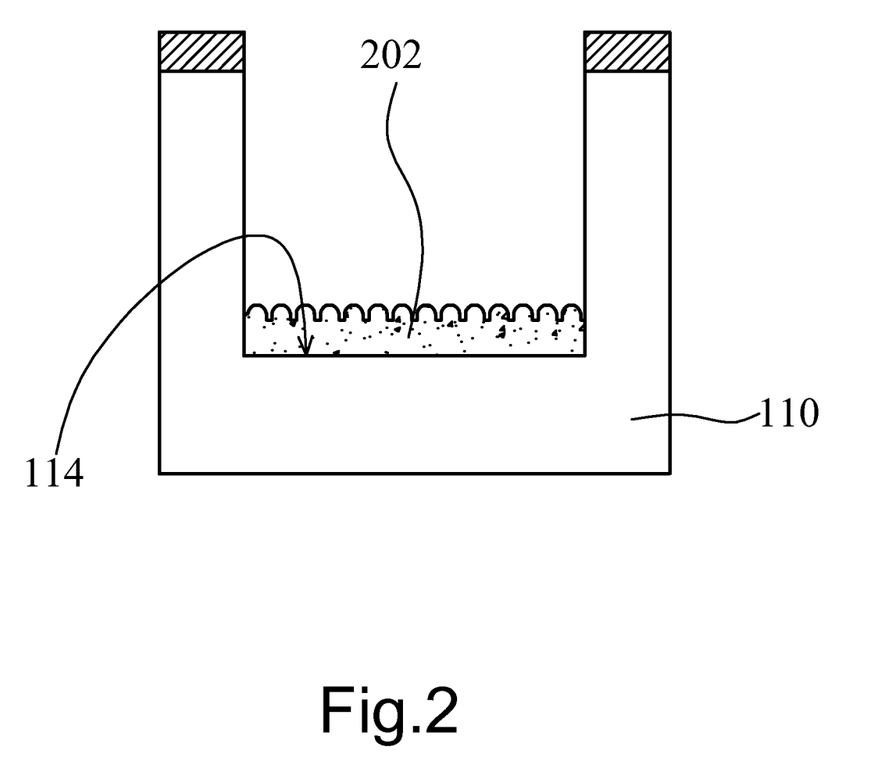
FIG. 2 is a sectional view illustrating the exemplar MEMS device in accordance with some embodiments.

FIG. 2 is a sectional view illustrating the exemplar MEMS device in accordance with some embodiments. As shown in FIG. 2, a first layer 202 formed of titanium nitride is formed over the bottom surface 114 of the substrate 110. The first layer 202 has a thickness of about 10-100 nanometers. The first layer 202 is formed by using physical vapor deposition or chemical vapor deposition.

Figure 3:
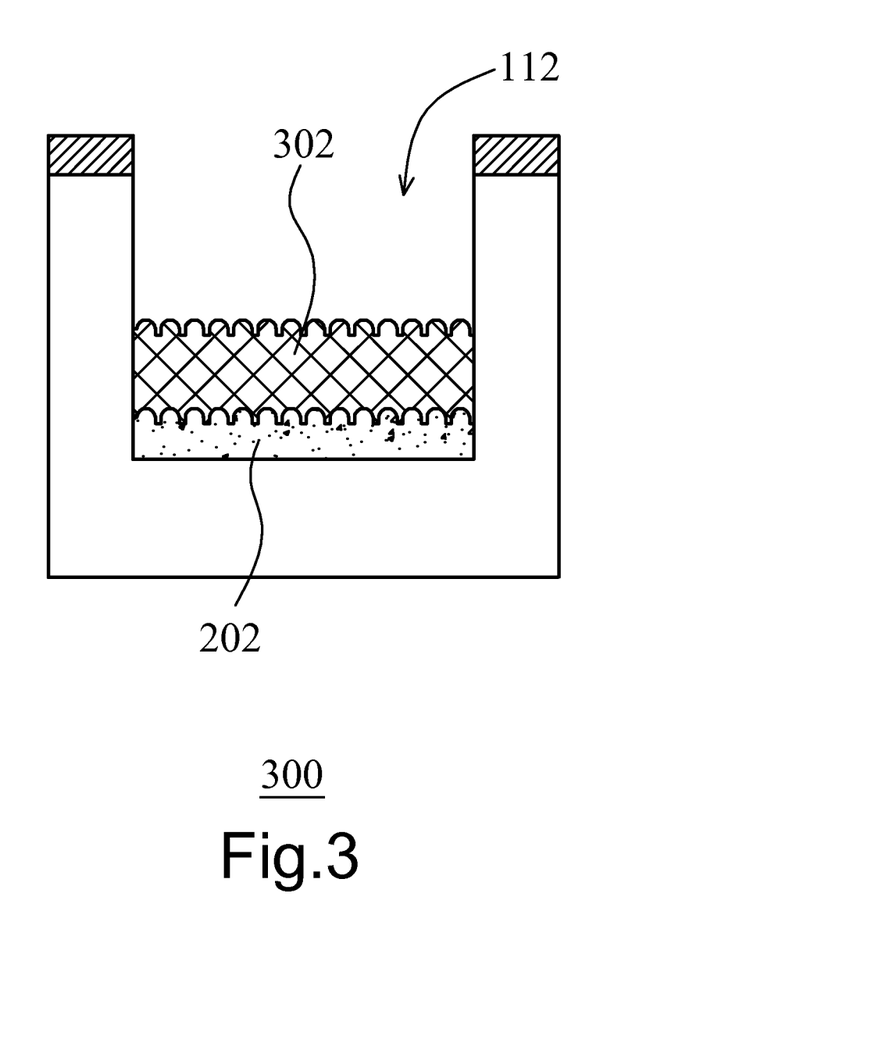
FIG. 3 is a sectional view illustrating the exemplar MEMS device in accordance with some embodiments.

FIG. 3 is a sectional view illustrating the exemplar MEMS device in accordance with some embodiments. As shown in FIG. 3, a second layer 302 formed of titanium over the first layer 202 is formed, and a MEMS device 300 is provided. The second layer 302 has a thickness of about 300-3000 nanometers. The second layer 302 is formed by using physical vapor deposition or chemical vapor deposition. The second layer 302 is formed as a getter to adsorb gas inside the MEMS device 300. Additionally, the cavity 112 of the MEMS device 300 may be further sealed in other semiconductor processes which are not described herein.

Figure 4:
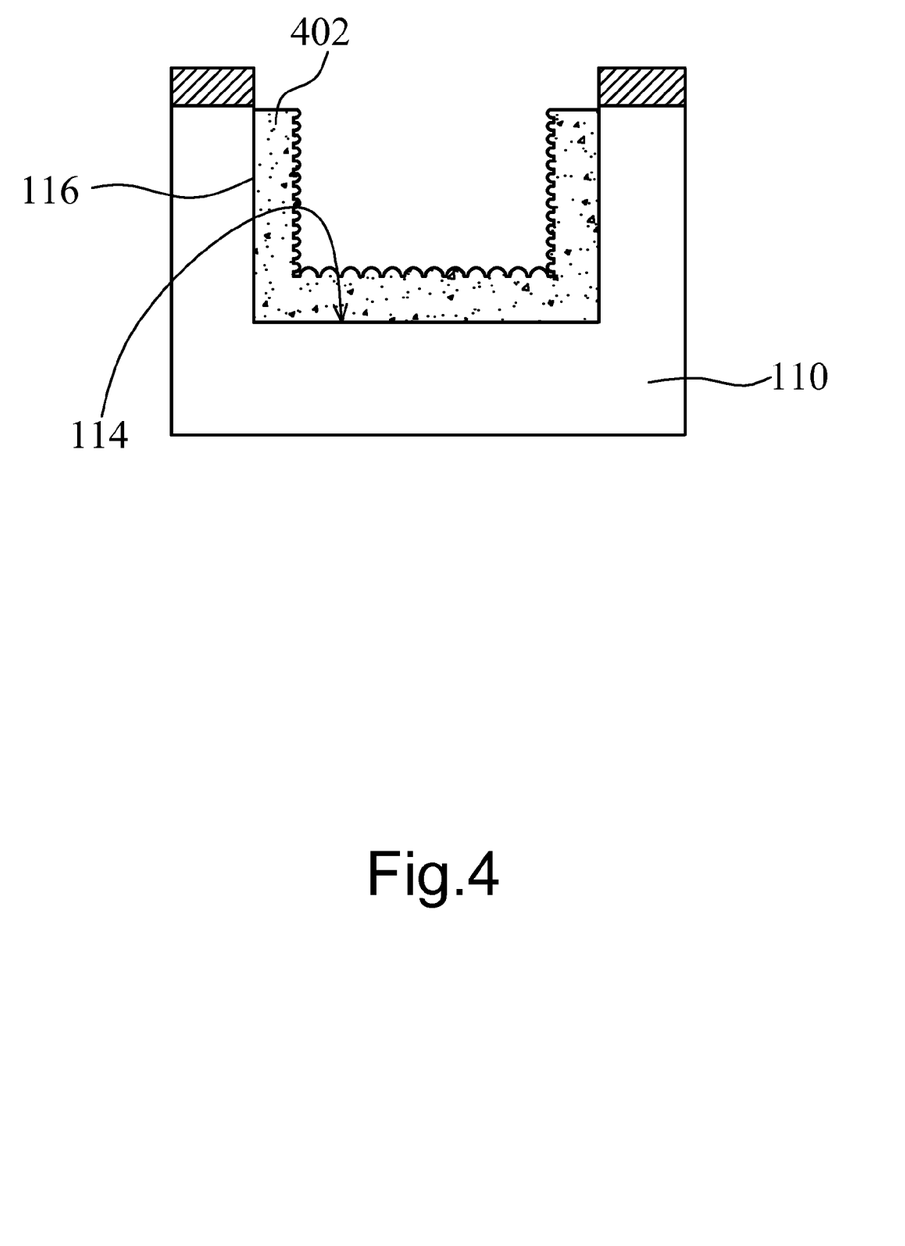
FIG. 4 is a sectional view illustrating the exemplar MEMS device in accordance with some embodiments.

FIG. 4 is a sectional view illustrating the exemplar MEMS device in accordance with some embodiments. Continuing from FIG. 1, as shown in FIG. 4, a first layer 402 formed of titanium nitride over the bottom surface 114 and the sidewall 116 of the substrate 110 and is formed. The first layer 402 has a thickness of about 10-100 nanometers.

Figure 5:
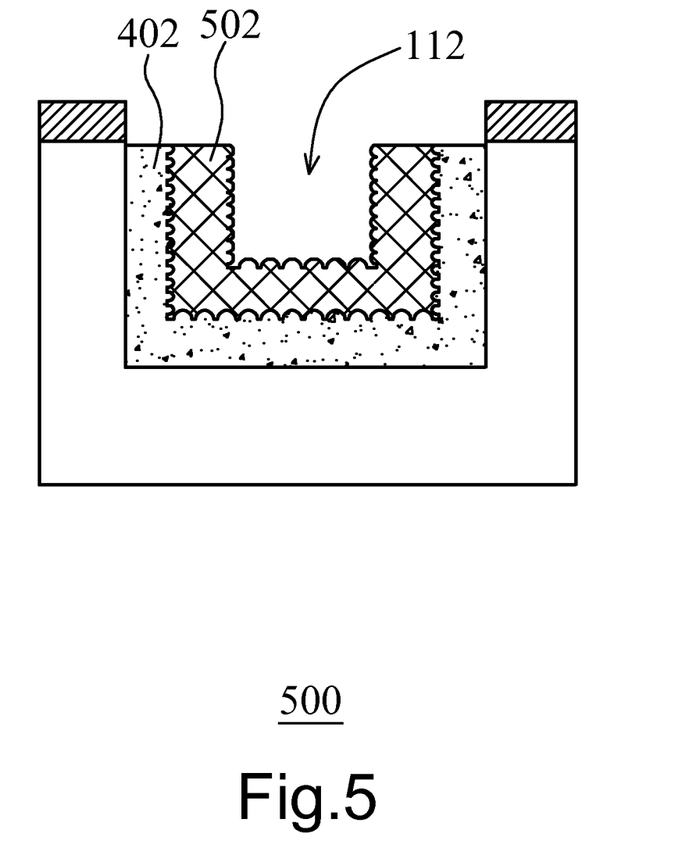
FIG. 5 is a sectional view illustrating the exemplar MEMS device in accordance with some embodiments.

FIG. 5 is a sectional view illustrating the exemplar MEMS device in accordance with some embodiments. As shown in FIG. 5, a second layer 502 formed of titanium is formed over the first layer 402, and a MEMS device 500 is provided. The second layer 502 has a thickness of about 300-3000 nanometers. The second layer 502 is formed by using physical vapor deposition or chemical vapor deposition. The second layer 502 is formed as a getter to adsorb gas inside the MEMS device 500. Additionally, the cavity 112 of the MEMS device 500 may be further sealed and vacuum in other semiconductor processes which are not described herein.

Figure 6:
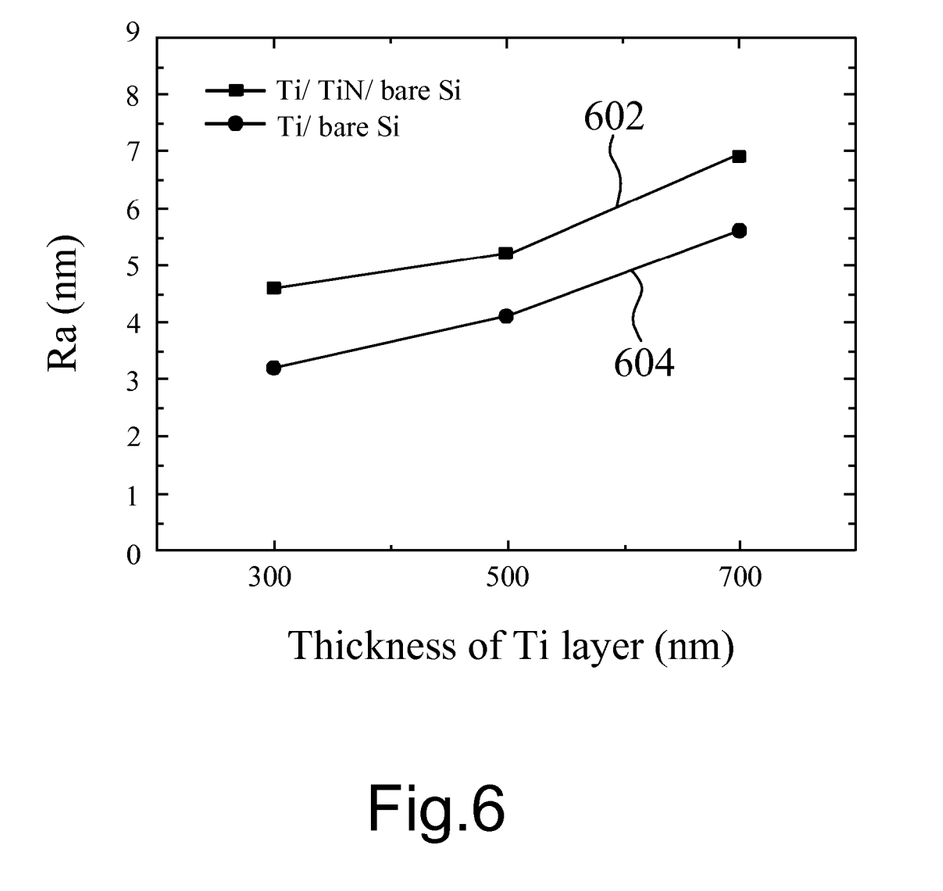
FIG. 6 is a plot illustrating the increase of surface roughness by using the exemplar MEMS device in accordance with some embodiments.

FIG. 6 is a plot illustrating the increase of surface roughness by using the exemplar MEMS device in accordance with some embodiments. The horizontal axis refers to the thickness of the second layer. The vertical axis refers to the roughness average (Ra), which is the arithmetic average of the absolute values of the vertical distance from the mean line to the measuring point. We made two experiments to obtain the two results 602, 604.

In one experiment, we setup the MEMS device as the configuration in FIG. 3 to obtain the result 602. The first layer formed of titanium nitride has a thickness of about 50 nanometers. The second layer formed of titanium varies from 300 nanometers to 700 nanometers. In the other experiment, we also setup the MEMS device having the titanium getter being directed deposited over the substrate without the titanium nitride layer therebetween to obtain the result 604. For example, with the thickness of the second layer formed of titanium being 300 nanometers, the result 602 with the first layer shows that Ra is 4.6 nanometers, and the result 604 without the first layer shows that Ra is 3.2 nanometers. It is demonstrated that surface roughness of the titanium layer over the titanium nitride layer improves compared to the titanium layer being directed deposited over the substrate without the titanium nitride layer therebetween.

Figure 7A:
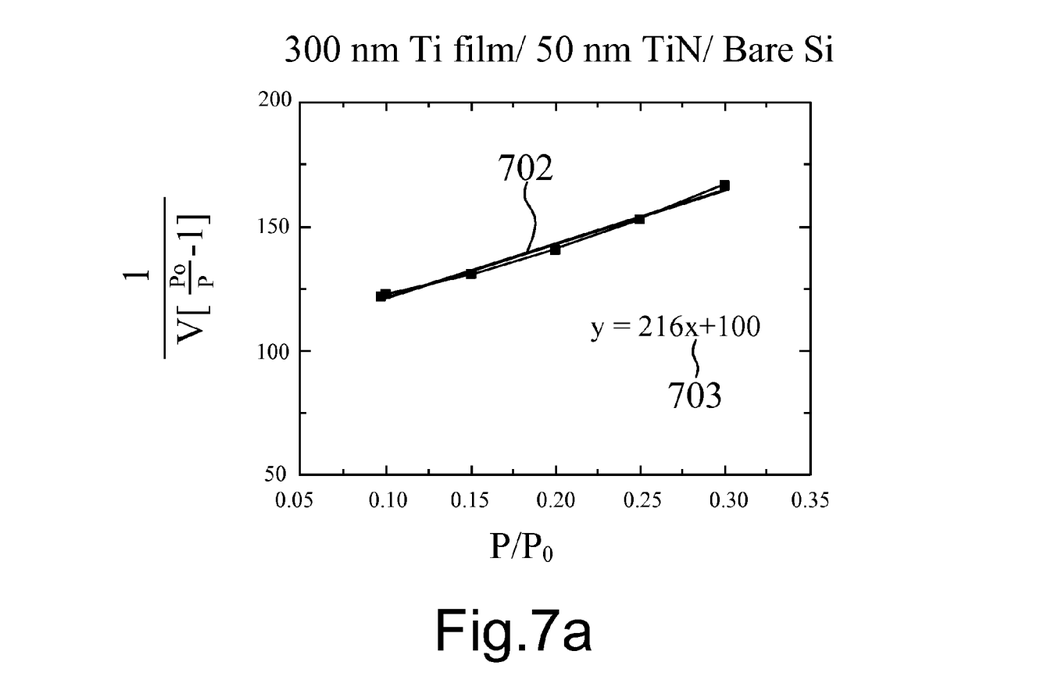
FIGS. 7a and 7b are Brunauer-Emmett-Teller (BET) plots illustrating the physical adsorption of gas molecules on a getter by using the exemplar MEMS device in accordance with some embodiments.
Figure 7B:
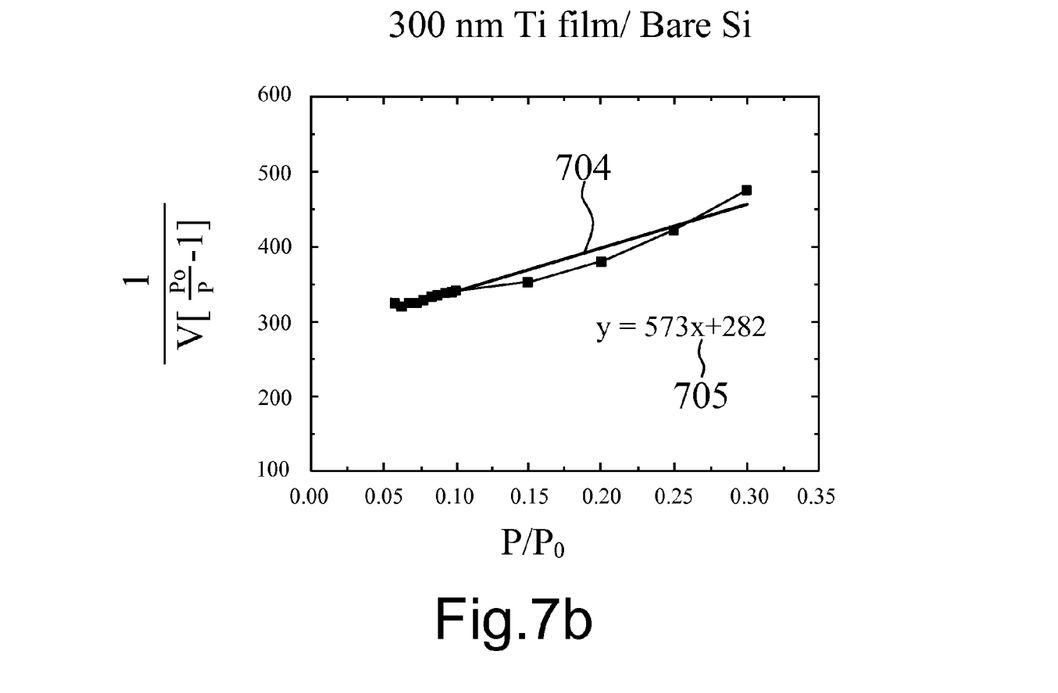

FIGS. 7a and 7b are Brunauer-Emmett-Teller (BET) plots illustrating the physical adsorption of gas molecules on a getter by using the exemplar MEMS device in accordance with some embodiments. We made two experiments to obtain the two results 702, 704.

In one experiment, we setup the MEMS device as the configuration in FIG. 3 to obtain the result 702. The first layer formed of titanium nitride has a thickness of about 50 nanometers. The second layer formed of titanium has a thickness of about 300 nanometers. In the other experiment, we also setup the MEMS device having the titanium getter being directed deposited over the substrate without the titanium nitride layer therebetween to obtain the result 704. With the result 702 and the corresponding linear regression equation 703, we extract the adsorbed gas quantity to be 11.04 $m^2/g$; with the result 704 and the corresponding linear regression equation 705, we extract the adsorbed gas quantity to be 4.10 $m^2/g$. It is demonstrated that surface area of the titanium layer over the titanium nitride layer multiplies by 2.8 times compared to the titanium layer being directed deposited over the substrate without the titanium nitride layer therebetween.

Figure 8:
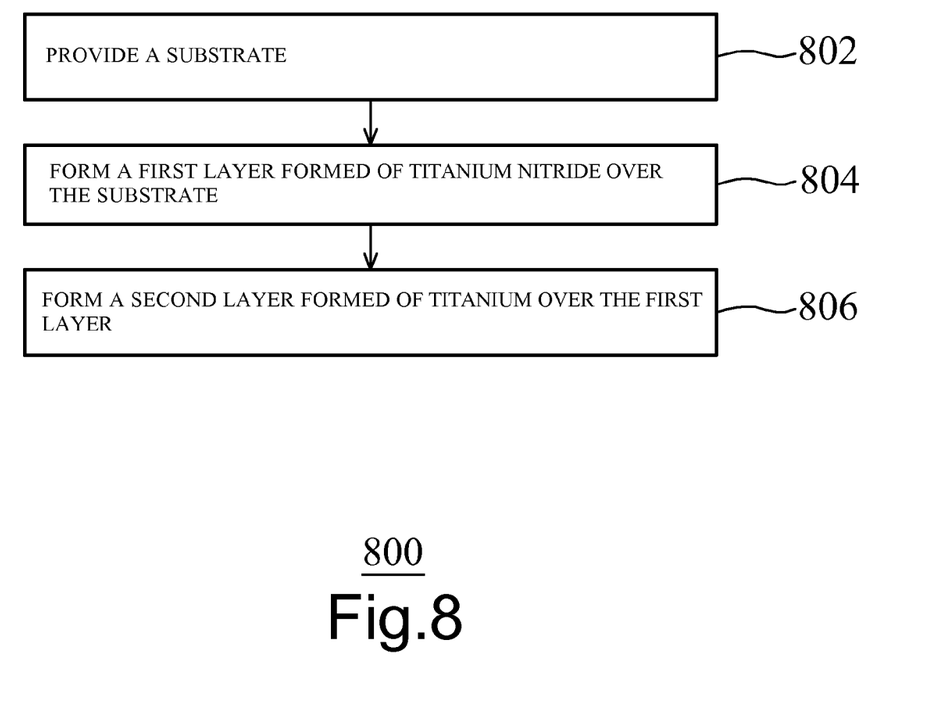
FIG. 8 is a flow chart for a method forming a MEMS device in accordance with some embodiments.

FIG. 8 is a flow chart for a method forming a MEMS device in accordance with some embodiments. As shown in FIG. 8, a method 800 is provided. The method 800 includes the following operations: providing a substrate (802); forming a first layer formed of titanium nitride over the substrate (804); and forming a second layer formed of titanium over the first layer (806).

According to an exemplary embodiment, a method of forming a MEMS device is provided. The method includes the following operations: providing a substrate; forming a first layer formed of titanium nitride over the substrate; and forming a second layer formed of titanium over the first layer.

According to an exemplary embodiment, a MEMS device is provided. The device includes: a substrate; a first layer formed of titanium nitride over the substrate; and a second layer formed of titanium over the first layer.

According to an exemplary embodiment, a getter structure is provided. The structure includes: a first layer formed of titanium nitride over a substrate; and a second layer formed of titanium over the first layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a MEMS device, comprising:
   providing a substrate of a first material;
   forming in the substrate a cavity located between bonding sites on a top surface of the substrate, the cavity having a bottom surface and a sidewall comprising substantially smooth surfaces, and the bottom surface and the sidewall being of a common material that is the first material;
   forming roughened interior surfaces within the cavity by forming a first layer of titanium nitride in direct contact with at least a portion of the sidewall and the bottom surface of the cavity, the first layer comprising a roughened surface having an uneven thickness; and
   forming a getter layer configured to adsorb gas within the cavity by depositing the getter layer inside the cavity, the getter layer being formed of titanium in direct contact with the roughened surface of the first layer.

2. The method of claim 1, wherein the getter layer that is configured to adsorb the gas inside the MEMS device.

3. The method of claim 1, wherein the first layer is formed using physical vapor deposition or chemical vapor deposition.

4. The method of claim 1, wherein the first layer has a thickness of about 10-100 nanometers.

5. The method of claim 1, wherein the first layer has a thickness of about 50 nanometers.

6. The method of claim 1, wherein the getter layer is formed using physical vapor deposition or chemical vapor deposition.

7. The method of claim 1, wherein the getter layer has a thickness of about 300-3000 nanometers.

8. The method of claim 1, wherein the first layer is in direct contact with the sidewall of the cavity.

9. The method of claim 1, wherein the first material is silicon.

10. The method of claim 1, further comprising: forming a eutectic material on the top surface of the substrate at positions within the bonding sites.

11. A MEMS device, comprising:
    a substrate comprising a first material, wherein the substrate includes a cavity located between bonding sites on a top surface of the substrate, the cavity having a bottom surface and a sidewall comprising substantially smooth surfaces, and the bottom surface and the sidewall being of a common material that is the first material;
    roughened interior surfaces formed within the cavity comprising a first layer of titanium nitride in direct contact with at least a portion of the sidewall and the bottom surface of the cavity, the first layer comprising a roughened surface having an uneven thickness; and
    a getter layer formed inside the cavity that is configured to adsorb gas within the cavity, the getter layer being formed of titanium in direct contact with the roughened surface of the first layer.

12. The device of claim 11, wherein the getter layer is configured to adsorb the gas inside the MEMS device.

13. The device of claim 11, wherein the first layer has a thickness of about 10-100 nanometers.

14. The device of claim 11, wherein the first layer has a thickness of about 50 nanometers.

15. The device of claim 11, wherein the getter layer has a thickness of about 300-3000 nanometers.

16. The device of claim 11, wherein the first layer is in direct contact with the sidewall.

17. The device of claim 11, wherein the first material is silicon.

\* \* \* \* \*